(12) United States Patent
Durocher et al.

(10) Patent No.: US 8,904,631 B2
(45) Date of Patent: Dec. 9, 2014

(54) METHOD OF FABRICATING AN INTERCONNECT DEVICE

(75) Inventors: Kevin Matthew Durocher, Waterford, NY (US); William Edward Burdick, Jr., Niskayuna, NY (US); Yuru Alexeyevich Plotnikov, Niskayuna, NY (US); David DeCrescente, Jr., Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 690 days.

(21) Appl. No.: 13/087,404

(22) Filed: Apr. 15, 2011

(65) Prior Publication Data

US 2012/0261165 A1    Oct. 18, 2012

(51) Int. Cl.
*H05K 3/02*     (2006.01)
*H05K 3/10*     (2006.01)
*H05K 3/24*     (2006.01)
*H05K 3/42*     (2006.01)
*H05K 1/03*     (2006.01)
*H05K 3/40*     (2006.01)

(52) U.S. Cl.
CPC .............. *H05K 3/246* (2013.01); *H05K 3/242* (2013.01); *H05K 3/42* (2013.01); *H05K 1/0393* (2013.01); *H05K 3/4069* (2013.01)
USPC .................................. 29/846; 29/830; 29/852

(58) Field of Classification Search
CPC .................... H01L 2224/16225; H01L 24/11; H05K 3/384; H05K 2201/09563; H05K 2201/0959; H05K 2203/072; H05K 3/0094; H05K 2203/0733; H05K 2201/0394; H05K 3/007; H05K 3/181; C23C 28/321; C23C 28/322
USPC ............ 29/846, 830, 840, 852; 174/250, 254, 174/257, 266
See application file for complete search history.

(56) References Cited

U.S. PATENT DOCUMENTS

| | | | |
|---|---|---|---|
| 4,581,301 A * | 4/1986 | Michaelson | 428/551 |
| 4,598,167 A | 7/1986 | Ushifusa et al. | |
| 4,859,571 A | 8/1989 | Cohen et al. | |
| 5,536,908 A * | 7/1996 | Etchells et al. | 174/257 |
| 6,320,140 B1 | 11/2001 | Enomoto | |

* cited by examiner

*Primary Examiner* — Thiem Phan
(74) *Attorney, Agent, or Firm* — Melissa K. Dobson (57) ABSTRACT

An interconnect device and a method for fabricating same. An embodiment of the invention includes sequential steps of providing a flexible substrate, forming vias through the flexible substrate, applying a conductive seed layer including first and second portions, applying conductive materials including first and second portions, copper plating the substrate, and then removing the second portions of the conductive seed layer and the conductive materials.

13 Claims, 7 Drawing Sheets

METHOD OF FABRICATING AN INTERCONNECT DEVICE

FIELD

The present disclosure relates to a interconnect devices and processes for fabricating interconnect devices, such as flexible printed circuits, and more particularly to a print and plate process for producing interconnect devices for use in electronic systems, in particular imaging systems, such as, for example, magnetic resonance imaging systems.

BACKGROUND

It is known to create electrical interconnection layers. Printed circuit boards are such an example of fabricating electrical interconnect layers between electrical insulating layers to form rigid electrical interconnect systems. It is also known to create electrical interconnections between layers of electrical insulating layers to form flexible interconnect systems, such as, for example, flexible printed circuits. The rigidity or flexibility of the resulting circuits is dependent on the choice of design, features, materials and processes used.

Flexible printed circuits have found applicability in numerous applications. One such application is in magnetic resonance imaging equipment. Magnetic resonance imaging (MRI) equipment uses radio frequency coils to scan a body. The coils include a conductive loop and in-series capacitors. It often is necessary to form the radio frequency coils of an MRI device on a flexible substrate, due to the many varied applications in which such a device is used and the desire to maximize performance by conforming the device to the non-planar patient anatomy.

It is known to provide such radio frequency coils on a flexible substrate. Prior methods for doing so generally include providing traditionally applied circuitry on relatively expensive polymeric substrates and utilizing a subtractive process to arrive at a finished coil. Such prior methods are wasteful and environmentally troubling. Specifically, such prior methods subtract away copper applied on the substrate. The cost of copper is increasing, which has led to an increase in the cost to manufacture MRI coils. Further, chemicals that can adversely impact the environment are utilized in the known fabrication processes.

Figure 1:
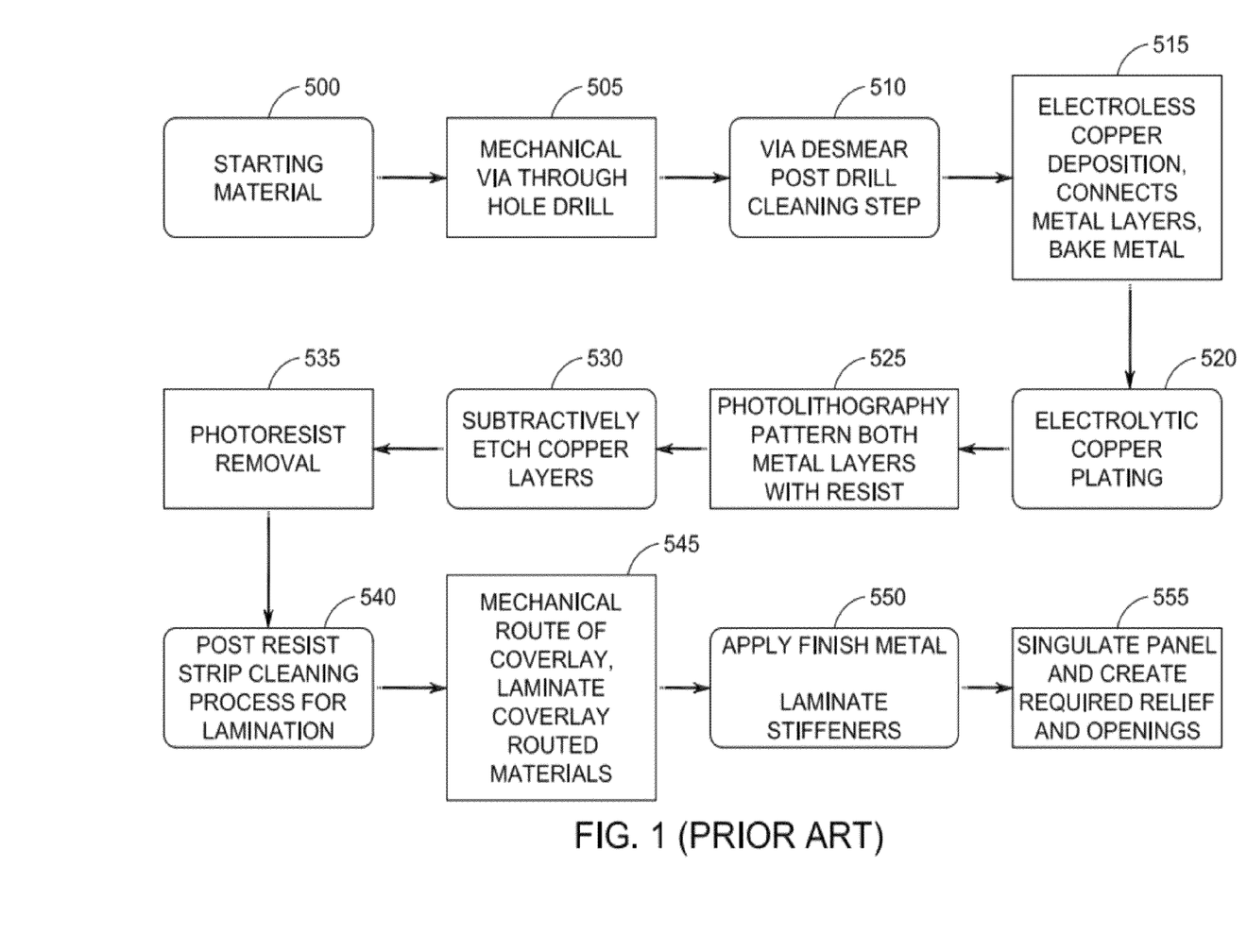
FIG. 1 is a schematic flow diagram illustrating a known method for fabricating an interconnect device.

With particular attention to FIG. 1, there is shown a process diagram illustrating a known method of fabricating interconnect devices. At step 500, starting materials are gathered, such as a flexible circuit board. In one example, a copper clad laminate board (e.g., FR Dupont) is used which can be 1 oz Cu/5 mil PI/1 oz Cu.

At step 505, vias are formed in the substrate through known means, such as, for example, through a mechanical drill, a chemical etching process, or a laser punch. Typically, the vias are 11-22 mil size. Further, any one of known printing methods is then utilized to make electrically conductive the vias thus formed. Examples of such printing methods include crossed conductive traces or filling a via sufficiently to connect to an underlying conductor/trace, and dispensing a conductive material such as paste or ink to create a partially or completely filled via. The latter is sufficient in two metal layer structures. However, that method has limited or no application in multi-layer (three, or more, metal layers). The vias are then, at step 510, de-smeared and cleaned.

At step 515, copper is deposited in an electroless deposition process and baked to cure. For the case where the device is a two metal layer device, the metal layers are connected and then the metal is baked. At step 520, copper plating is provided through an electrolytic plating process. For a two layer device, both sides of the substrate are copper plated. Some devices will be used in certain applications that will require a relatively thicker layer of copper. For example, some applications will require thicknesses of approximately 18 µm, 35 µm, or 75 µm. To achieve such thicknesses, industry standard is to use a starting copper thickness or apply, respectively, one-half an ounce, one ounce, or two ounces of copper.

Next, at step 525, a subtractive portion of the known process begins. Specifically, photolithography patterns are created on both metal layers using resistive material. At step 530, the copper layers are subtractively etched along the patterns. At step 535, remaining photoresist material is removed. This stripping step may require a pH adjustment. Most photoresist removers or stripping agents are basic in nature, i.e., have a pH greater than 7. These photoresist removers or stripping agents can require that the resultant materials on the substrate are further treated with chemistry to neutralize the pH. Thus, for example, if the surface were left with a basic pH, then a mild acid neutralization process may be used.

Step 540, a post-resist stripping and cleaning process step, is followed by lamination step 545. Specifically, a covering material is laminated into place over the substrate. Then, at step 550, any needed finish metal is applied along with laminate stiffeners. The finish metal—metal applied to the copper interconnect for next level assembly or capping of the copper interconnect to prevent oxidation—may be applied through any conventional process, such as, for example, by way of an organic surface protectant (OSP) process, a tinning process, or by way of a hot air solder level (HASL) process. The laminate stiffeners are used to support the substrate. They are typically placed on the backside of the substrate where one would join components to the active side of the substrate metal.

Finally, at step 555, the panel is singulated and required relief and openings are created. Singulation is the process of removing the active circuit from the substrate panel from which it is built. Often multiple circuits can be built in a single panel and they need to be de-panelized.

Although circuits with three, or more layers are produced, most flexible printed circuits include either one metal layer (1ML) or two metal layers (2ML). Most printed circuits that include electrically conductive traces that have been printed to a substrate have an electrical conductivity substantially less than that of copper, e.g., one half to one third the electrical conductivity of copper. Best-in-class flexible printed circuits claim up to one-half the electrical conductivity of copper.

Lower cost and/or large area electric circuits, with electrical performance equivalent to existing commercially available products are desired. These circuits include low cost, high volumes applications, e.g., RFID, smart labling, and sensor patches. As well, these circuits include large area circuits, e.g., lighting, display, and antenna or sensor arrays. Drop-on-demand, screen/stencil, gravure, and other like methods have been developed, utilized, or optimized to satisfy the need for low cost, large area printed electric interconnect, circuits and systems. These printing methods are compatible with producing either rigid or flexible electrical interconnect systems. However, due to limitations of the electrical properties of the materials used in these printed circuits, electrical performance parity with circuits fabricated using conventional methods and materials has not been achieved.

What is desired are improved interconnect devices, such as flexible printed circuits, and methods of fabricating the same. Such improved interconnect devices would include electrical interconnections having electrical conductivity greater than half that of copper. Such improved methods would desirably address the waste inherent in known methods as well as the adverse environmental impact of known methods.

SUMMARY

An embodiment of the system provides an interconnect device that includes a substrate having at least one via therethrough, a patterned conductive seed layer printed on opposing sides of the substrate, a portion of the patterned conductive seed layer extending into the at least one via, and a primary conductor layer joined to the patterned conductive seed layer and extending into the at least one via.

An embodiment provides a method for fabricating an interconnect device. The method includes the sequential steps of providing a substrate, then forming vias through the substrate, then printing a patterned conductive seed layer onto the substrate, and then joining a primary conductor layer to the substrate.

A further embodiment provides an RF antenna that includes a receiver coil. The receiver coil includes a substrate having at least one via therethrough, a patterned conductive seed layer printed on opposing sides of the substrate, a portion of the patterned conductive seed layer extending into the at least one via, and a primary conductor layer joined to the patterned conductive seed layer and extending into the at least one via.

These and other features, aspects and advantages of the present invention may be further understood and/or illustrated when the following detailed description is considered along with the attached drawings.

DETAILED DESCRIPTION

The present specification provides certain definitions and methods to better define the embodiments and aspects of the invention and to guide those of ordinary skill in the art in the practice of its fabrication. Provision, or lack of the provision, of a definition for a particular term or phrase is not meant to imply any particular importance, or lack thereof; rather, and unless otherwise noted, terms are to be understood according to conventional usage by those of ordinary skill in the relevant art.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.).

The modifier "about" used in connection with a quantity is inclusive of the stated value and has the meaning dictated by the context (e.g., includes the degree of error associated with measurement of the particular quantity). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described inventive features may be combined in any suitable manner in the various embodiments.

As illustrated in FIGS. 2-6, an interconnect device is shown in various stages of fabrication. The interconnect device shown is a flexible printed circuit device, such as a MRI receiver coil. It is to be understood that other interconnect devices may be fabricated in the same manner as described herein.

Figure 2:
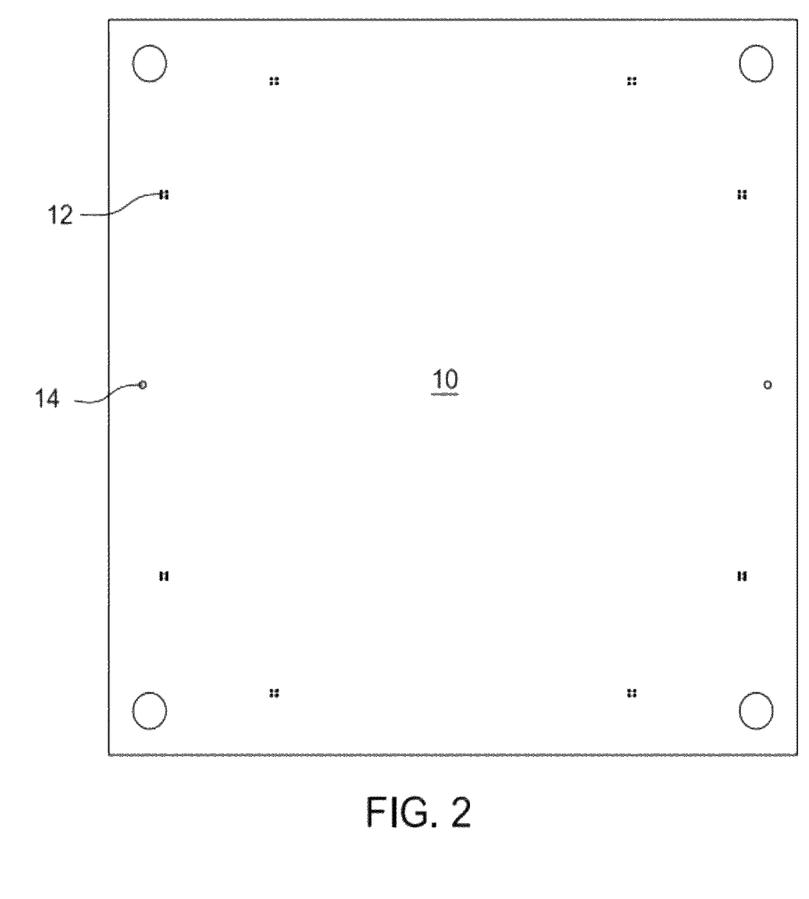
FIG. 2 is a top view illustrating a substrate being prepared in accordance with one embodiment.

As more particularly illustrated in FIG. 2, a substrate 10 is provided. The substrate 10 may be formed of inexpensive flexible materials, such as, for example, a polyester (PET) material such as MYLAR®, a polyethylene naphthalate (PEN) material such as TEONEX®, or a thermoplastic polyimide material such as ULTEM®. By utilizing such materials for the substrate 10, a substrate cost reduction of up to 10 times is possible.

Vias 12 may then be formed in the substrate 10. The vias 12 may be formed through any known conventional methodology, such as, for example, mechanically (mechanical drill or router or punch tools), chemically (etchant), or electrically (laser). Importantly, the chosen via construction method needs to be compatible with two, or more, metal layer interconnect structures. Further, the via construction method chosen should support smaller diameter vias than the print-dispense/fill via construction method. Smaller vias and land pads translate to finer interconnect features, e.g., conductor width and spacing between conductors. In addition, the print and plate vias 12 can be filled or open. Vias created with a print-dispense/fill via construction can only be created filled.

Additionally, fiducial marks 14 may be placed on the substrate 10. The fiducial marks 14 are used to ensure that the metal, to be later positioned on the substrate, is positioned in the proper location.

Figure 3:
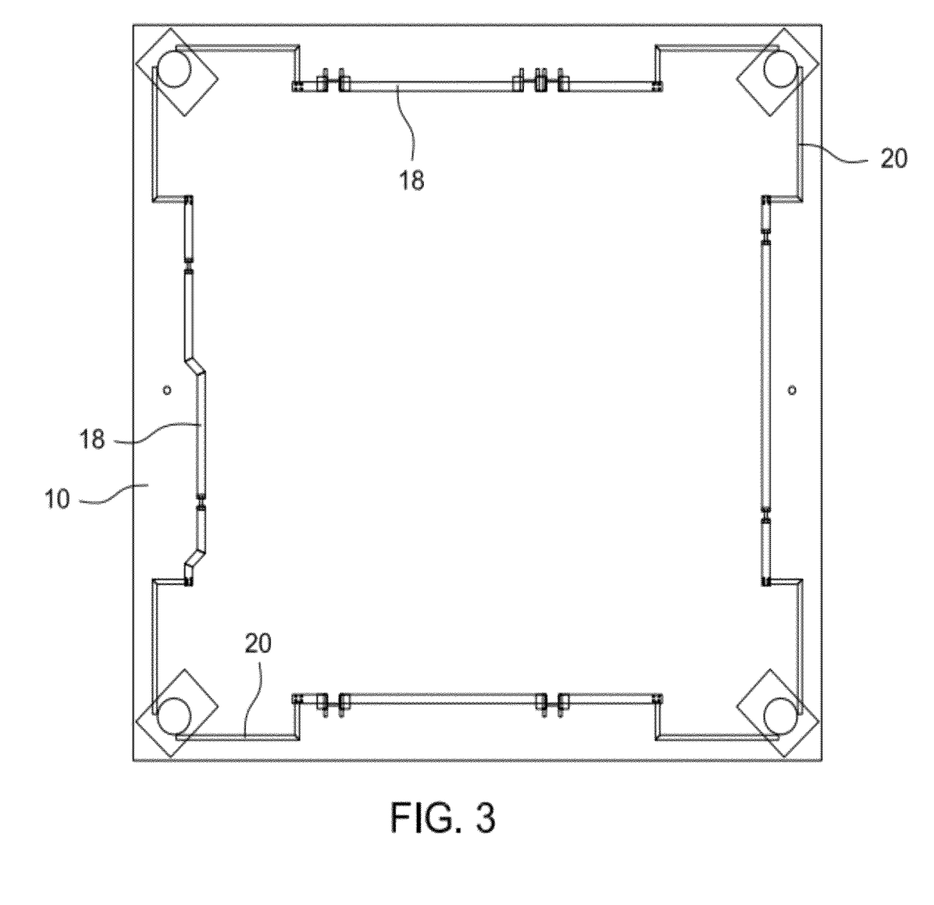
FIG. 3 is a top view of the substrate of FIG. 2 having metal printing in accordance with one embodiment.

The substrate 10 is then cleaned with a solvent, acid, base, or plasma. This is done to ensure good adherence of a seed layer. As shown in FIG. 3, a conductive seed layer is put down in a pattern. Specifically, the conductive seed layer is applied to the substrate in an additive process. For example, the patterned conductive seed layer is printed on the substrate 10. While a single layer of patterned conductive seed is shown in FIG. 3, it should be understood that a second layer of conductive seed may be put down on an opposite side of the substrate 10 and electrically interconnected with the first conductive seed layer through the vias 12. Numerous conductive materials may be utilized, such as, for example, silver or nano-silver ink or paste, copper ink or paste, or graphene ink or paste. The conductive seed layer that is laid down is formed into via portions 16 (FIGS. 5(a)-5(c)), a first portion 18 and a second portion 20.

The via portions 16 are positioned in the vias 12. The via portions 16 may be positioned such that they adhere to walls 13 of the vias (FIG. 5(a)) or such that they both adhere to the walls 13 and extend across the vias 12 themselves (FIGS. 5(b) and 5(c)). The second portion 20 of the patterned conductive seed layer, the bussing structure, will be removed at a later step in the process, while the first portion 18, the finished circuitry, will remain on the substrate 10.

The patterned conductive seed layer may be applied through numerous known application processes, such as, for example, screen printing, dispensing, flexographic printing, gravure printing, and inkjet printing. The typical layer thicknesses can range from about 0.1 µm to about 5 µm. Of importance is the achievement of desired electrical performance and/or mechanical reliability. To achieve the former, one needs materials with superior electrical conductivity, compared to what is widely used in printing today. With respect to the latter, one needs sufficient adhesion and thickness to maintain the integrity of the interconnect during stress within the use environment, for example twisting, bending, etc. Typical screen printing results in thicknesses between 5 and 20 µm, rotary printing results in a thickness of about 2 µm, and gravure and inkjet printing results in thicknesses between about 0.2 to 2 µm. The thickness ranges depend in part on the viscosity and composition of the materials used and in part on the application process chosen for the application of the materials.

Figure 4:
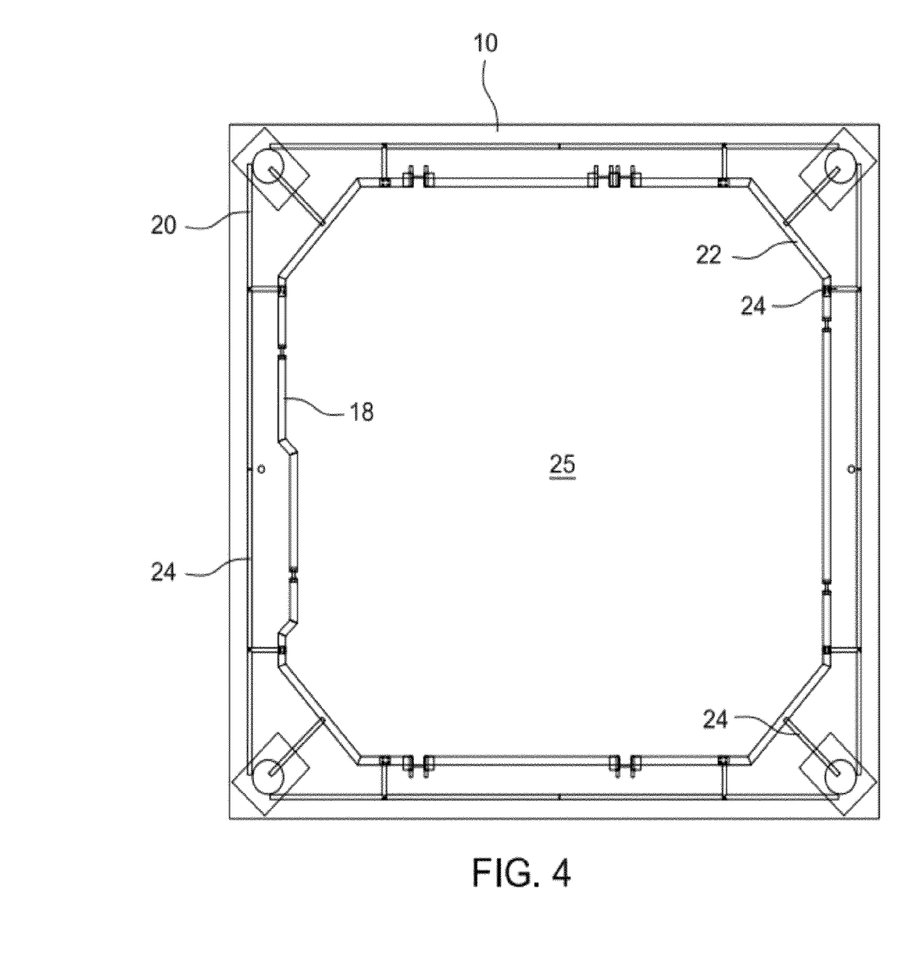
FIG. 4 is a top view of the substrate of FIG. 3 with bus lines plated thereon in accordance with one embodiment.

FIG. 4 illustrates the substrate 10 after the initial application of a patterned seed layer of conductive material. A second set of conductive materials, specifically first and second portions of bus ligatures 22, 24 are printed on the substrate 10. The bus ligatures 22, 24 may be put down at the same time as the seed layer of conductive material but in a different location. The bus ligatures 22, 24 are put down to facilitate electroplating, since all metal structures that require additional metal/copper thickness by electroplating process need to be electrically connected at the same potential. Although only one second set of conductive materials are shown in FIG. 4, it is to be understood that another second set of conductive materials may be formed on an opposite side of the substrate 10 and electrically interconnected through the vias 12 with the second set of conductive materials on the first side of the substrate 10. Then, a primary conductor layer 25 is plated directly to the substrate having the conductive seed layer and the bus ligatures. The plating may be an electrolytic plating process. Specifically, the plating may be a copper plating process. Alternatively, and as an additional step, additional conductor material, such as additional copper, could be added using an electroless process. Prior to the electrolytic plating step, it is possible to apply an electroless copper coating if necessary for processing requirements and/or seed passivation. The thickness of the primary conductor layer 25 is dependent upon the specific application for which the finished device is intended. The primary conductor layer 25 may utilize one-half an ounce, an ounce, two ounces, or more of a metal, such as copper. The primary conductor layer 25 may attain a thickness in the range from 10 µm to 80 µm. The desired thickness of the primary conductor layer 25 is chosen to achieve desired device characteristics, such as, for example, conductivity, impedance, etc.

As shown in FIG. 4, the patterned conductive seed layer first and second portions 18, 20 and the bus ligature first and second portions 22, 24 are positioned at respective inner and outer locations on the substrate 10. Specifically, first portions 18, 22 are positioned at inner locations on the substrate 10, while second portions 20, 24 are positioned at outer locations on the substrate.

Figure 5A:
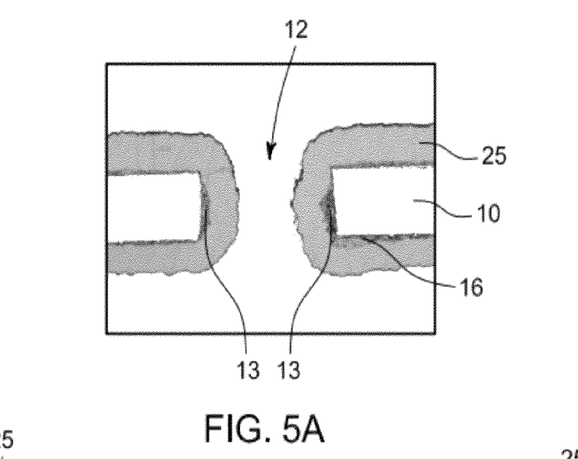
FIGS. 5(a)-5(c) are cross-sectional views illustrating various metallized vias in accordance with one embodiment.
Figure 5B:
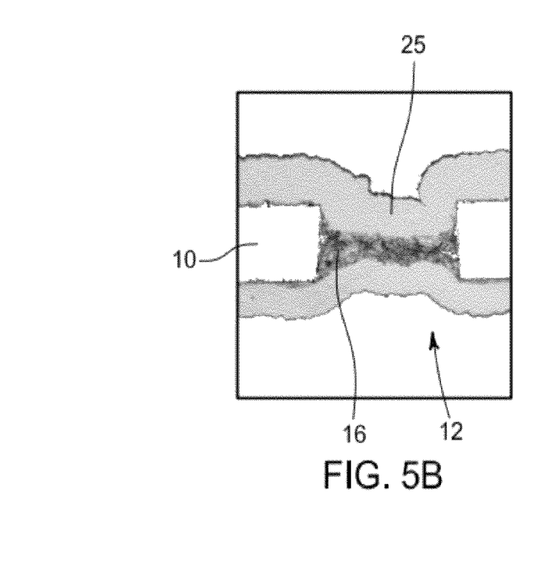
Figure 5C:
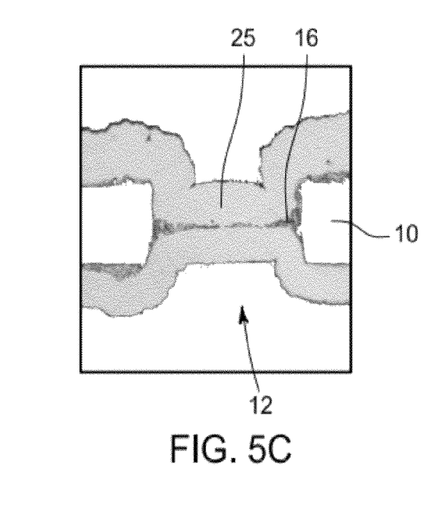

FIGS. 5(a)-5(c) illustrate three types of vias 12, in accordance with an embodiment of the invention. As shown, the vias 12 are filled with an electrically conductive material. Specifically, FIGS. 5(a)-5(c) show via portions 16 adhering to the walls 13 of the vias 12 and adhering to both sides of the substrate 10. As shown, however, the via portions 16 are not consistently applied in terms of thickness, and several areas are completely devoid of any via portion 16, especially at the regions where the side walls of the via intersect the conductors. The application of primary conductor layer 25 provides the desired consistency and thickness needed to create a sufficient electrical conductivity, or Q value, throughout the entire device. FIG. 5(a) shows a non-filled or conformal via, i.e., the copper plating 25 and the via portion 16 conformally line, or coat, the wall 13 of the via 12. FIG. 5(b) shows a filled via where the via hole is plugged with all or a majority of the ink or paste and then the copper is plated on the outside. FIG. 5(c) shows a minimal fill of ink or paste and the majority of the filled hole comprises copper. As illustrated, the primary conductor layer 25 and the via portion 16 adhere to the wall 13 and extending across the via 12. FIGS. 5(b) and 5(c) respectively illustrate filled vias, each with a different fill factor and geometry. The via illustrated in FIG. 5(c) is nearly completely filled, as desired for electrical performance (sensitivity of high frequency analog signals to irregular conductor geometries) or reliability.

Figure 6:
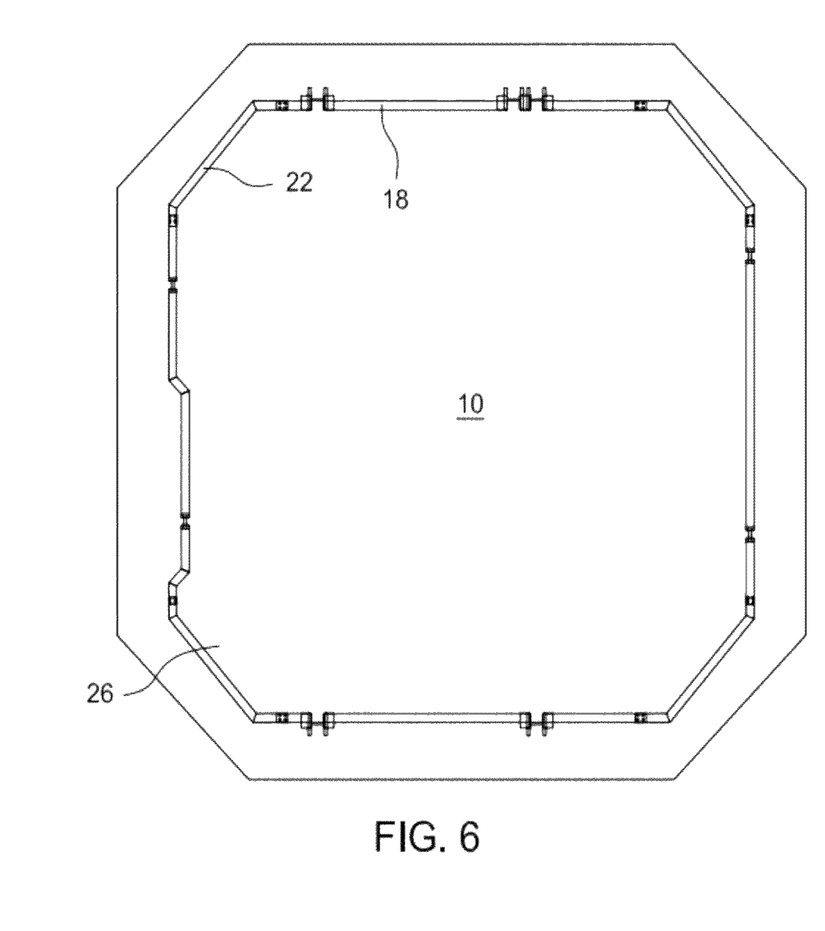
FIG. 6 is a top view of the substrate of FIG. 4 having been debussed in accordance with one embodiment.

FIG. 6 illustrates the removal, or de-bussing, of the second portions 20, 24 from the substrate 10. This de-bussing or removal of the plating ligature outer portions 20, 24 may be accomplished with a mechanical router, punch, or through a laser profile operation. Removal of the second portions 20, 24 is important as those printed bus wires may act as antennas when the finished device is used, especially at higher frequencies.

Finally, a cover layer 26 is applied to protect the electrically conductive metal traces and to serve as a mask for any required second level assembly operations. Openings in the cover layer 26 are pre-routed, punched or laser profiled, and then aligned to the substrate and laminated thereto. Any needed finish metal can be applied in panel format prior to final excising or routing. Specifically, circuits may be processed in a panel, usually with multiple circuits per panel. While in panel form it is easier to metalize IO pads with the desired pad metal, prior to removal of the buses (if electroplating is required) and/or singulation. Finish metals may be applied by, for example, a tin process, an electroless nickel immersion gold process (ENIG), an electroless nickel immersion palladium immersion gold process (ENIPIG), an organic surface protectant process (OSP) or any other non-electrolytic materials process.

Figure 7:
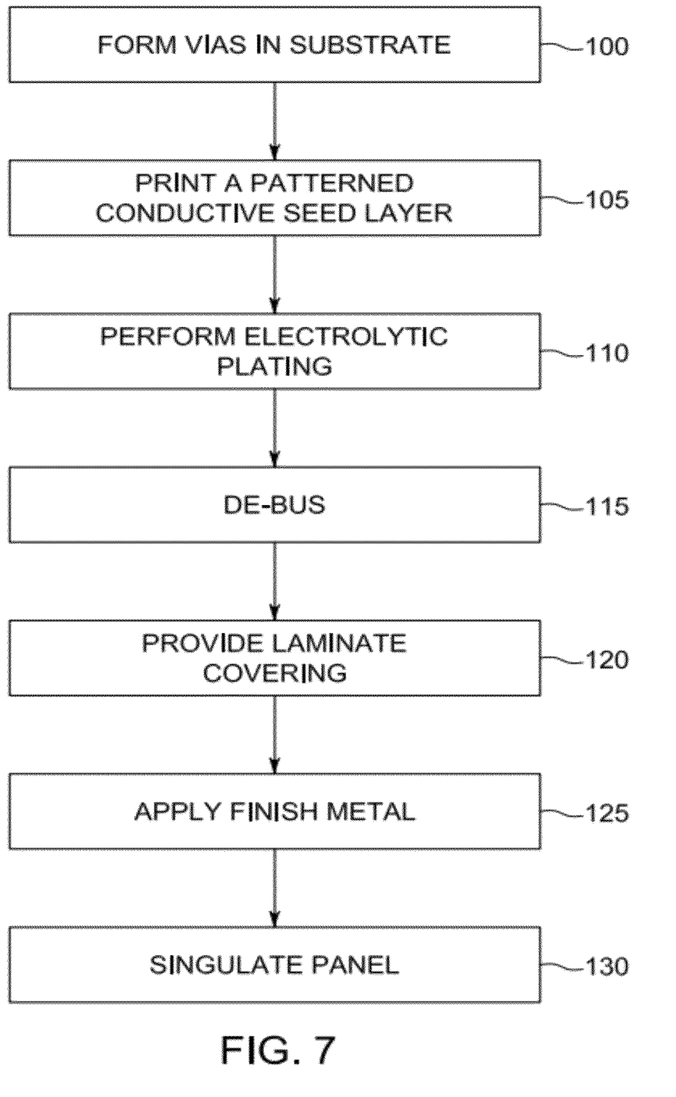
FIG. 7 is a schematic view illustrating processing steps for fabricating an interconnect device in accordance with one embodiment.

FIG. 7 illustrates a process flow chart of a print and plate process for fabricating a flexible printed circuit device including electrical interconnections in accordance with an embodiment of the invention. Beginning at step 100, a substrate, such as substrate 10, is prepared by forming vias therein. Then, at step 105, a patterned conductive seed layer is printed onto the substrate. The patterned conductive seed layer may be on one side of the substrate or both sides of the substrate. Material used to form the patterned conductive seed layer is also introduced to the vias, adhering on the walls of the vias or on the walls and extending across the vias. The patterned conductive seed layer may be formed of any suitable conductive material, such as, for example, silver, nano-silver, copper inks, graphene inks, and copper pastes. The patterned conductive seed layer may be applied through numerous known application processes, such as, for example, screen printing, dispensing, flexographic printing, gravure printing, and inkjet printing. After the seed layer, additional metal may be applied to the substrate.

An electrolytic plating step is then performed at step 110. The electrolytic plating step is required to ensure that the finished product, for example, an MRI receiver coil, has a sufficient quality, or Q value. To have a sufficiently robust Q value requires a metallization process that will apply the conductor material to affect high conductivity. In the case of copper, the thickness of the conductor would need to be relatively thick. By relatively thick is meant at a thickness greater than is currently practical by use of typical materials used in printing methods. For MR applications the typical thickness range for received coils would be 10 μm-80 μm. The thickness of the seed ink or paste conductor will impact the required amount of bulk copper. The thickness of the copper plating depends on the amount of copper plating used. To obtain a thickness of copper in the range of from 10 μm to 80 μm, one-half to two ounces of copper will be necessary in the plating process.

At step 115, bussing structures are removed, or de-bussed. These portions are not required for the proper working of the finished device. Further, their continued presence within the finished device may lead to those portions acting as antennas, especially in applications at high frequencies, ultimately leading to a deteriorated performance of product.

A covering is provided at step 120 and laminated onto the substrate. The covering may have had openings pre-formed therein. The laminated covering may be used as a substrate for a second layer of metallization, as well as a protective covering for the copper metallization laid down on the substrate.

Finish metal may be applied at step 125. The finish metal is applied to the IO pads to make them ready for joining to components or other circuit elements. The finish metal may be applied through tin, OSP, ENIG, or other like processes to prepare the IO pads for soldering. Finally, at step 130 the circuit is singulated to remove it from the multiple circuits that may be in the process panel.

The print and plate process described with reference to FIGS. 2-7 can be performed in either a batch mode or a roll-to-roll continuous mode. Through the print and plate process as illustrated in FIG. 7, and as described with reference to FIGS. 2-6, method steps that are necessary in prior art processes are not necessary. Specifically, there is no need for the use of photoresist material and photolithography patterns. There is also no etching step required, and thus no photoresist material removal step either.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while embodiments have been described in terms that may initially connote singularity, it should be appreciated that multiple components may be utilized. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method for fabricating an interconnect device, consisting of the following in consecutive order:
    (a) providing a substrate; then
    (b) forming vias through the substrate; then
    (c) printing a patterned conductive seed layer onto the substrate; then
    (d) joining a primary conductor layer to the substrate; then
    (e) applying a covering over the primary conductor layer; and then
    (f) applying finish metal;
wherein said step of joining a primary conductor layer to the substrate, the primary conductor layer is at a thickness range of about 10 μm to 80 μm; and wherein said step of printing said patterned conductive seed layer provides an electrical conductivity throughout the interconnect device greater than half the Q value of copper.

2. The method of claim 1, wherein steps (a) through (d) are performed in a batch process.

3. The method of claim 1, wherein steps (a) through (d) are performed in a continuous process.

4. The method of claim 1, wherein said substrate is formed of a flexible material.

5. The method of claim 1, wherein said forming vias through the substrate is accomplished mechanically, chemically, or electrically.

6. The method of claim 5, wherein said forming vias through the substrate comprises at least one from the group consisting of drill, router, punch, etchant, or laser.

7. The method of claim 1, wherein said patterned conductive seed layer comprises at least one from the group consisting of silver ink or paste, nano-silver ink or paste, copper ink or paste, or graphene ink or paste.

8. The method of claim 1, wherein said patterned conductive seed layer comprises a finished circuit portion and a bussing structure portion.

9. The method of claim 8, further comprising removing said bussing structure portion after said joining a primary conductor layer to the substrate step.

10. The method of claim 1, wherein said applying a patterned conductive seed layer comprises at least one from the group consisting of screen printing, dispensing, flexographic printing, gravure printing, and inkjet printing.

11. The method of claim 1, wherein said joining a primary conductor layer step comprises electrolytically copper plating.

12. The method of claim 11, wherein said electrolytically copper plating creates a metallization layer of between about 5 μm and 80 μm.

13. The method of claim 11, wherein said electrolytically copper plating creates a metallization layer of between about 10 μm and 80 μm.

* * * * *

UNITED STATES PATENT AND TRADEMARK OFFICE
CERTIFICATE OF CORRECTION

| | | |
|---|---|---|
| PATENT NO. | : 8,904,631 B2 | Page 1 of 1 |
| APPLICATION NO. | : 13/087404 | |
| DATED | : December 9, 2014 | |
| INVENTOR(S) | : Durocher et al. | |

It is certified that error appears in the above-identified patent and that said Letters Patent is hereby corrected as shown below:

On the Title Page, Item (75), delete "Yuru" and insert -- Yuri --, therefor.

In the Specification

Column 2, Line 51, delete "labling" and insert -- labeling --, therefor.

Column 6, Line 46, delete "10" and insert -- IO --, therefor.

Signed and Sealed this
Seventh Day of April, 2015

Michelle K. Lee
*Director of the United States Patent and Trademark Office*